(12) United States Patent
Wei et al.

(10) Patent No.: US 9,136,182 B2
(45) Date of Patent: Sep. 15, 2015

(54) METHOD FOR MANUFACTURING SEMICONDUCTOR DEVICE

(71) Applicant: SEMICONDUCTOR MANUFACTURING INTERNATIONAL (SHANGHAI) CORPORATION, Shanghai (CN)

(72) Inventors: Qingsong Wei, Shanghai (CN); Shukun Yu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/280,254

(22) Filed: May 16, 2014

(65) Prior Publication Data
US 2015/0179528 A1 Jun. 25, 2015

(30) Foreign Application Priority Data

Dec. 20, 2013 (CN) .......................... 2013 1 0706433

(51) Int. Cl.
*H01L 21/3205* (2006.01)
*H01L 21/8238* (2006.01)
*H01L 29/49* (2006.01)

(52) U.S. Cl.
CPC ........ *H01L 21/823864* (2013.01); *H01L 29/49* (2013.01)

(58) Field of Classification Search
USPC .......................................... 438/595, 183, 926
See application file for complete search history.

(56) References Cited

U.S. PATENT DOCUMENTS

2012/0094459 A1* 4/2012 Park et al. ..................... 438/299

* cited by examiner

*Primary Examiner* — Timor Karimy
(74) *Attorney, Agent, or Firm* — Innovation Counsel LLP

(57) ABSTRACT

A method for manufacturing a semiconductor device may include forming a gate structure that includes a dummy gate member on a substrate. The method may further include forming two first-type spacers such that the dummy gate member is positioned between the first-type spacers. The method may further include forming two second-type spacers such that the first-type spacers are positioned between the second-type spacers. The method may further include forming two third-type spacers such that the second-type spacers are positioned between the third-type spacers. The method may further include performing etch to remove the third-type spacers and to at least partially remove the second-type spacers. The method may further include removing at least a portion of the dummy gate member to form a space between remaining portions of the first-type spacers. The method may further include providing a metal material in the space for forming a metal gate member.

20 Claims, 7 Drawing Sheets

METHOD FOR MANUFACTURING SEMICONDUCTOR DEVICE

CROSS-REFERENCE TO RELATED APPLICATION

This application claims priority to and benefit of Chinese Patent Application No. 201310706433.4, filed on 20 Dec. 2013, the Chinese Patent Application being incorporated herein by reference in its entirety.

BACKGROUND OF THE INVENTION

The present invention is related to a method for manufacturing a semiconductor device. For example, the present invention may be related to a method for manufacturing a high-k metal gate (HKMG) semiconductor device, i.e., a semiconductor device that includes a high-k member (with a dielectric constant higher than the dielectric constant of silicon dioxide or 2.5) and a metal gate member.

Manufacturing of an HKMG semiconductor device may involve minimization of oxygen diffusion and removal of a polysilicon dummy gate. For minimizing oxygen diffusion, spacers (e.g., offset spacers) in the device may be formed of silicon nitride (SiN). Nevertheless, chemicals used and/or generated during processing of the SiN spacers may substantially obstruct the removal of the polysilicon dummy gate and/or may cause an undesirable trapezoidal profile of a space for receiving metal gate material. The trapezoidal profile may undesirably affect the filling of the metal gate material and formation of the metal gate member. For example, unwanted voids may be formed in the metal gate member. As a result, the quality of the HKMG semiconductor device and/or the associated manufacturing yield may be undesirable.

SUMMARY

An embodiment of the present invention may be related to a method for manufacturing of a semiconductor device. The method may include forming a dummy gate structure on a substrate. The dummy gate structure may include a dummy gate member, which may be formed of a polysilicon material. The method may further include forming two first-type spacers such that the dummy gate member is positioned between the two first-type spacers. The method may further include forming two second-type spacers such that the two first-type spacers and the dummy gate member are positioned between the two second-type spacers. The method may further include forming two third-type spacers such that the two second-type spacers, the two first-type spacers, and the dummy gate member are positioned between the two third-type spacers. The method may further include performing etch (i.e., an etching process) to substantially completely remove the two third-type spacers and to at least partially remove the two second-type spacers. The method may further include removing at least a first portion of the dummy gate member to form a space between remaining portions of the two first-type spacers. The method may further include providing a metal material in the space for forming a metal gate member.

The dummy gate structure may be formed on a shallow trench isolation (STI), an N-type metal-oxide-semiconductor (NMOS) region, or a P-type metal-oxide-semiconductor (PMOS) region of the substrate. The method may be performed at one or more of a STI, an NMOS region, and a PMOS region of the substrate.

The etch (or etching process) may be stress proximity technique (SPT) wet etch. The etch may be performed using a phosphoric acid ($H_3PO_4$). The etch may be performed at a temperature of 115° C.

The first-type spacers may have a first etch rate in the etch. The second-type spacers may have a second etch rate in the etch. The third-type spacers may have a third etch rate in the etch. The first etch rate may be less than the second etch rate. The second etch rate may be less than or equal to the third etch rate.

The third etch rate may be greater than five times the first etch rate. The third etch rate may be greater than the second etch rate. The second etch rate may be less than eight times the first etch rate.

Each of the first-type spacers may include a silicon-nitride layer. The first-type spacers may include at least one of a carbon-doped atomic layer deposition silicon-nitride layer and a hexachloropropane silicon-nitride layer.

Each of the second-type spacers may include a silicon-nitride layer. Each of the second-type spacers may further include a silicon-oxide layer that overlaps the silicon-nitride layer. The second-type spacers may include at least one of an atomic layer deposition silicon-nitride layer and a chemical vapor deposition 760C silicon-nitride layer.

Each of the third-type spacers may include a silicon-nitride layer. Each of the third-type spacers may further include a silicon-oxide layer that overlaps the silicon-nitride layer. The third-type spacers may include a hexachlorodisilane silicon-nitride layer.

The method may include removing a second portion of the dummy gate member after performing the etch and before removing the first portion of the dummy gate member. The second portion of the dummy gate may have damage caused by the etch.

The method may include removing defective portions of the first-type spacers when removing the second portion of the dummy gate member. The defective portions of the first-type spacers may have defects caused by the etch.

A thickness of the second portion of the dummy gate member in a direction perpendicular to a bottom surface of the substrate may be in a range of 40 Å to 200 Å.

The etch may substantially completely remove the second-type spacers.

Portions of the second-type spacers may remain after the etch. A height of the remaining portions of the second-type spacers in a direction perpendicular to a bottom surface of the substrate may be less than a height of the remaining portions of the first-type spacers in the direction.

A thickness of each of the first-type spacers in a direction parallel to a bottom surface of the substrate may be in a range of 30 Å to 120 Å. A thickness of each of the second-type spacers in the direction may be in a range of 80 Å to 200 Å. A thickness of each of the third-type spacers in the direction is may be in a range of 80 Å to 200 Å.

The method may include controlling a height of remaining portions of the second-type spacers in a direction perpendicular to a bottom surface of the substrate by controlling at least one of the first etch rate, the second etch rate, the third etch rate, and a condition of the etch. The remaining portions of the second-type spacers may remain on the substrate after the etch.

The second-type spacers may overlap at least one of a drain and a source implemented in the substrate in a direction perpendicular to a bottom surface of the substrate.

The two second-type spacers may be formed at a PMOS region of the substrate. Subsequently, another two second-type spacers may be formed at an NMOS region of the substrate after a photoresist has been removed and before the formation of the third-type spacers.

Embodiments of the invention may enable effective protection of work function layers and/or effective formation of metal gate members in manufacturing of semiconductor devices. Therefore, satisfactory quality and/or performance of work function layers and/or metal gate members in semiconductor devices may be ensured. Advantageously, embodiments of the invention may contribute to satisfactory semiconductor device quality (and performance) and/or a satisfactory manufacturing yield.

The above summary is related to one or more of many embodiments of the invention disclosed herein and is not intended to limit the scope of the invention.

DETAILED DESCRIPTION

Example embodiments of the present invention are described with reference to the accompanying drawings. In the following description, numerous specific details are set forth in order to provide thorough understanding of the present invention. Embodiments of the present invention may be practiced without some or all of these specific details. Well known process steps and/or structures may not have been described in detail in order to not unnecessarily obscure the present invention.

Various embodiments, including methods and techniques, are described in this disclosure. It should be kept in mind that the invention might also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

FIGS. 1A to 1H show schematic cross-sectional views illustrating structures formed during manufacturing of a semiconductor device (e.g., an HKMG semiconductor device) in accordance with an embodiment of the present invention.

Figure 1A:
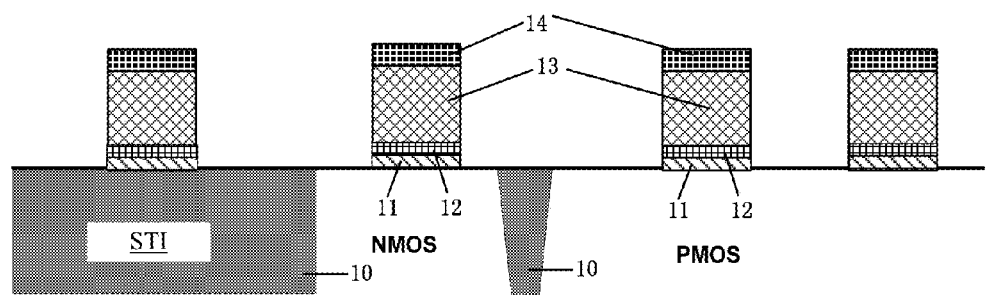
FIGS. 1A to 1H show schematic cross-sectional views illustrating structures formed during manufacturing of a semiconductor device (e.g., an HKMG semiconductor device) in accordance with an embodiment of the present invention.

Referring to FIG. 1A, the method for manufacturing the HKMG semiconductor device may include providing a substrate. The method may include forming shallow trench isolations 10 (STIs 10), an N-type metal-oxide-semiconductor (NMOS) region, and a P-type metal-oxide-semiconductor (PMOS) region in the substrate. The substrate may be formed of a well-known material. The shallow trench isolations 10 (STIs 10) and one or more active regions may be formed through, for example, a complementary metal-oxide-semiconductor (CMOS) process, such as lithography and/or etching. In each of the NMOS region and the PMOS region, a polysilicon dummy gate structure that includes a gate insulating layer 11, a work function material layer 12, and a polysilicon dummy gate member 13 may be sequentially formed on the substrate. The dummy gate structure may further include a hard mask 14. The gate insulating layers 11 may be formed of a high-k material. A high-k material may generally refer to a material with a dielectric constant k greater than 2.5. In an embodiment, the gate insulating layers 11 may be formed of at least one of HfO, HfZrO, HfSiO, HfSiON, HfLaO, etc. The work function material layers 12 may be formed of titanium nitride (TiN) and may apply tensile stresses and/or compressive stresses trenches and/or channels in the substrate. Hard masks 14 may be formed on the polysilicon dummy gate members 13. Additionally or alternatively, a dummy gate structure may be formed on an STI 10.

Figure 1B:
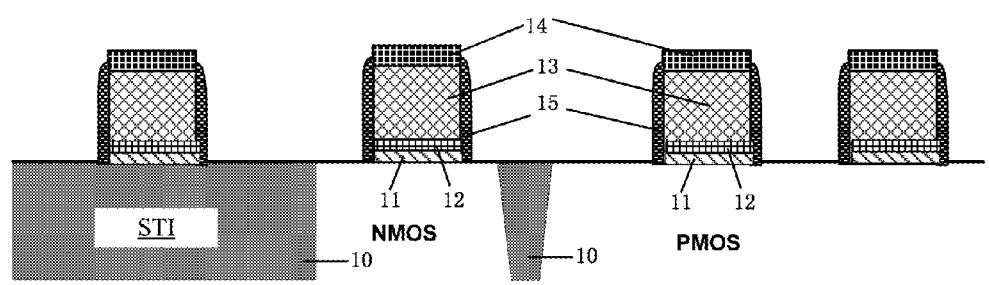

Referring to FIG. 1B, two offset spacers 15 (or first-type spacers 15) may be formed at two sides of each polysilicon dummy gate member 13, such that the polysilicon dummy gate member is disposed between the two offset spacers 15. The offset spacers 15 may be formed of pure silicon nitride (SiN) that has a first wet etch rate. In an embodiment, the offset spacers 15 may be formed using carbon-doped (C-doped) atomic layer deposition (ALD) SiN and/or hexachloropropane (HCC) SiN.

Figure 1C:
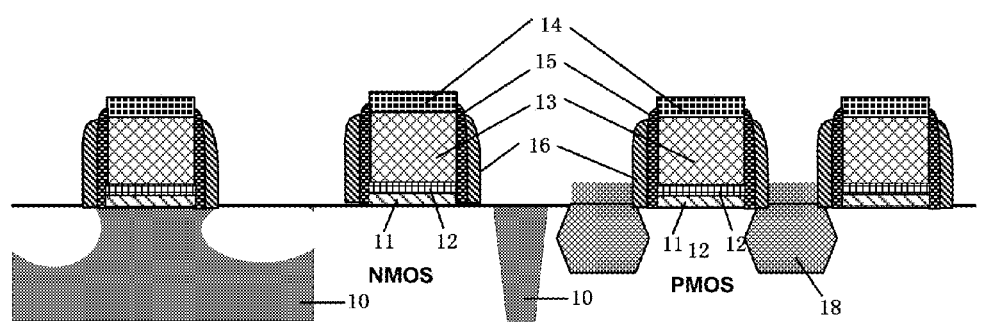

Referring to FIG. 1C, one or more silicon-germanium (SiGe) sources/drains 18 may be formed in the PMOS region. At two sides of every two offset spacers 15, two photosensitive resin (PSR) spacers 16 (or second-type spacers 16) may be formed, such that the two offset spacers 15 and a dummy gate structure may be disposed between the two PSR spacers 16. The PSR spacers 16 may be formed of a material that has a second wet etch rate. In an embodiment, the PSR spacers 16 may be formed of pure SiN, such as ALD SiN and/or chemical vapor deposition (CVD) 760C SiN. In an embodiment, the PSR spacers 16 may have a double-layer structure that may mainly include a (thicker) silicon nitride (SiN) film and may include a (thinner) silicon oxide ($SiO_2$) film.

Figure 1D:
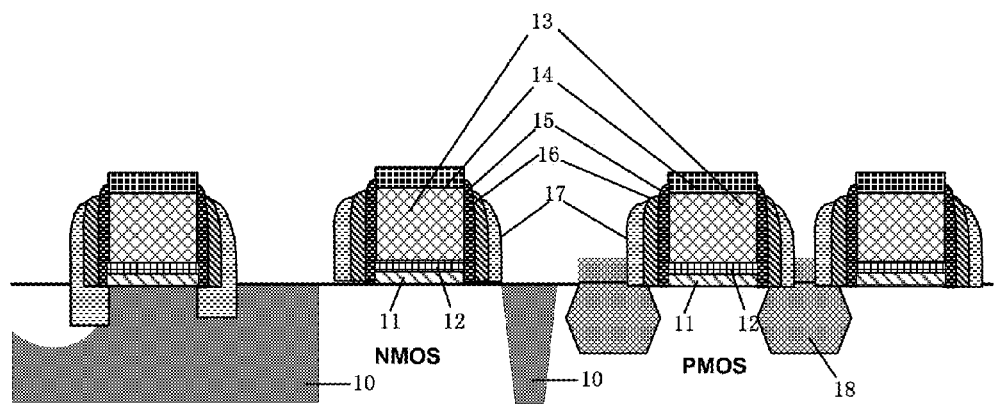

Referring to FIG. 1D, at two sides of every two PSR spacers 16, two main spacers 17 (or third-type spacers 17) may be formed, such that the two PSR spacers 16, two offset spacers 15, and a dummy gate structure may be disposed between the two main spacers 17. The main spacers 17 may be formed of a material that has a third wet etch rate. In an embodiment, the main spacers 17 may be formed of pure SiN, such as hexachlorodisilane (HCD) SiN. In an embodiment, the main spacers 17 may have a double-layer structure that may include a SiN film and a $SiO_2$ film, wherein the $SiO_2$ film may be thinner than the SiN film, and wherein the $SiO_2$ film may be disposed between the SiN film and the substrate and/or between the SiN film and an immediately neighboring PSR spacer 16.

Figure 1E:
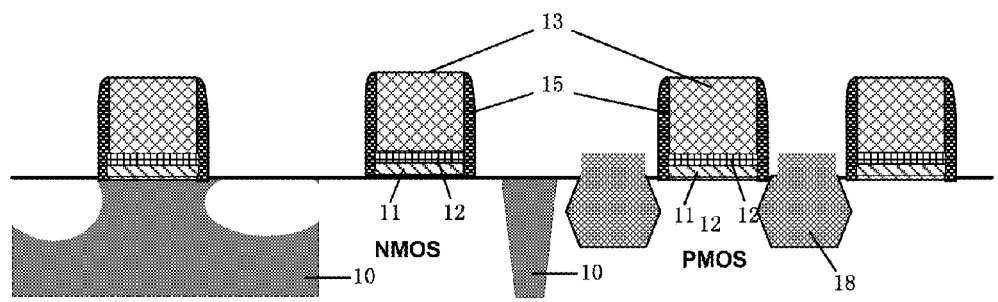

Referring to FIG. 1E, the method may include performing stress proximity technique (SPT) wet etch to substantially completely remove the main spacers 17, while substantially retaining the offset spacers 15. In the SPT wet etch, the first wet etch rate (which is associated with the offset spacers 15) may be less than the second wet etch rate (which is associated with the PSR spacers 16), and the second wet etch rate is less than or equal to the third etch rate (which is associated with the main spacers 17). Because the offset spacer material, the PSR spacer material, and the main spacer material have different etch rates in the SPT wet etch, the primary spacers 17 may be substantially completely removed, and the offset spacers 15 to may substantially remain to protect the polysilicon dummy gate members 13, the gate insulating layers 11, and/or the work function material layers 12. The PSR spacers may be substantially completely removed or partially retained.

Figure 1F:
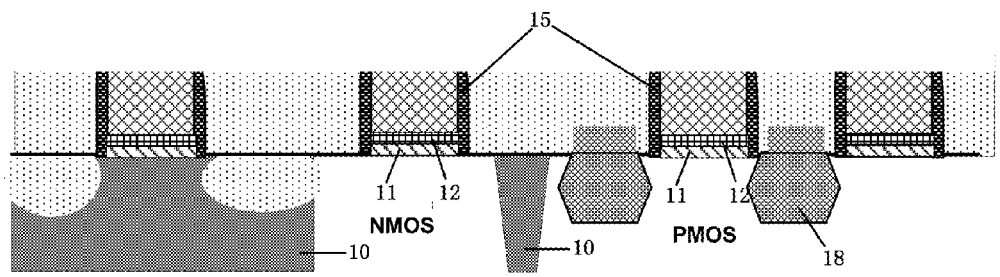

Referring to FIG. 1F, the method may include performing interface layer dielectric (ILD) chemical mechanical polishing (CMP). The ILD CMP may reduce the heights of the retained offset spacers 15 and the polysilicon dummy gate members 13.

Figure 1G:
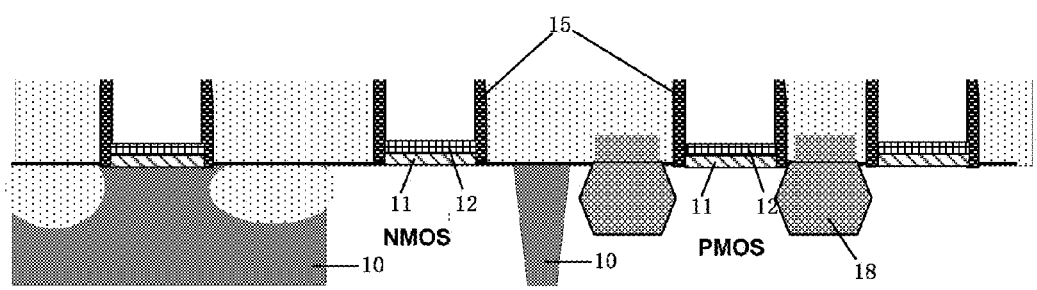

Referring to FIG. 1G, the method may include removing the polysilicon dummy gate members 13 to form spaces.

Figure 1H:
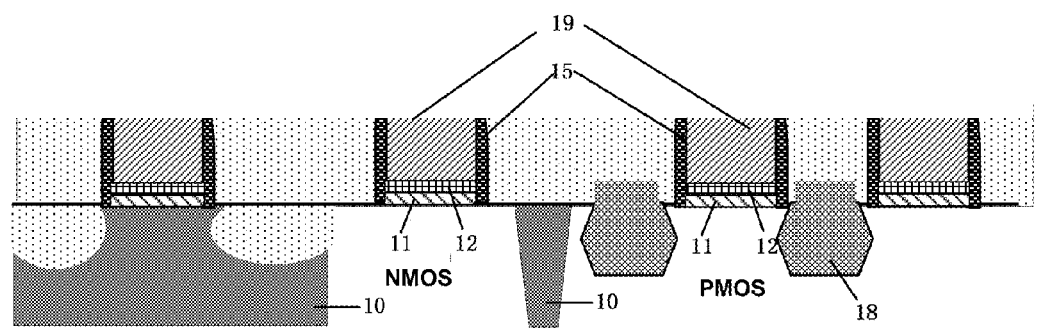

Referring to FIG. 1H, the method may include filling metal gate material in the spaces and performing chemical mechanical polishing on the filled metal gate material to form metal gate members 19.

According to embodiments of the invention, the etch rate difference(s) may maximize effectiveness and efficiency of the SPT wet etch. During the SPT wet etch, the offset spacers 15 (which have a low wet etch rate) may be substantially retained and may effectively protect the polysilicon dummy gate members 13. As a result, desirable structures (or profiles) of the polysilicon dummy gate members 13 may be maintained. Therefore, subsequent removal of the polysilicon dummy gate members 13 may be effectively performed to form desirable structures (and/or profiles) of the spaces, and the metal gate material may be effectively filled in the spaces with minimum voids or substantially no voids. Advantageously, the metal gate members 19 may have desirable quality. The retained offset spacers 15 may also effectively protect the work function material layers 12, e.g., titanium nitride (TiN) layers, such that the work function material layers 12 may be substantially maintained. Advantageously, desirable quality and performance of the HKMG semiconductor device may be ensured.

In an embodiment, the thickness of each offset spacer 15 may be in a range of 30 Å~120 Å (angstroms), the thickness of each PSR spacer 16 may be in a range of 80 Å~200 Å, and the thickness of each main spacer may be in a range of 80 Å~200 Å.

In an embodiment, during or after the PST wet etch, (minor) defects may occur in the offset spacers 15, and/or (shoulder) damage may occur in the polysilicon dummy gate members 13. The defects and/or damage may occur (and may be located) in portions of the offset spacers 15 and polysilicon dummy gate members 13 that are to be removed through the ILD CMP (illustrated in FIGS. 1E and 1F). Through the ILD CMP, the defects and/or damage may be substantially removed, such that the defects and/or damage may not substantially affect subsequent manufacturing steps or the quality of the semiconductor device. In an embodiment, the ILD CMP height loss of each polysilicon dummy gate 13 (i.e., the height/thickness of the portion of the polysilicon dummy gate members 13 to be removed through the ILD CMP) may be in a range of 40 Å~200 Å, and the (combined) height and/or (combined) size of the defects and/or damage may be less than the ILD CMP height loss of each polysilicon dummy gate 13.

Different types of SiN may be formed through different formation mechanisms, may have different crystal structures, and therefore may have different wet etch rates. Table 1 illustrates wet etch rates of different types of SiN at a given temperature (115° C.) in a hot phosphoric (HPO) acidic solution:

TABLE 1

| | Materials | | | | |
|---|---|---|---|---|---|
| | HCC SiN | C-doped ALD SiN | CVD 760C SiN | ALD SiN | HCD SiN |
| Wet etch rates (a.u.) | 1.0 | 1.1 | 2.5 | 3.2 | 9.1 |

As can be appreciated from Table 1, wet etch rates for different types of SiN may be substantially different. For example, among the types SiN shown in Table 1, HCC SiN may have the lowest wet etch rate (1.0), and HCD SiN may have the highest wet etch rate (9.1). In an embodiment, materials of the offset spacers 15, PSR spacers 16, and main spacer 17 may be selected from the SiN materials shown in Table 1 and may have a lowest wet etch rate, an intermediate wet etch rate, and a highest wet etch rate, respectively. For example, the offset spacers 15 may be formed of HCC SiN or C-doped ALD SiN (which may have a substantially low wet etch rate), the PSR spacers 16 may be formed of CVD 760C SiN or ALD SiN (which may have an intermediate wet etch rate), and the main spacers 17 may be formed of HCD SiN (which may have a substantially high wet etch rate).

An offset spacer 15 may be formed of only (pure) SiN. A PSR spacer 16 may include a pure SiN layer and may additionally include an $SiO_2$ layer that is thinner than the SiN layer.

The SPT wet etch may include using $H_3PO_4$ and/or one or more other chemicals (e.g., HF) suitable for etching SiN. The SPT wet etch may be performed at a temperature in a range of 100° C.~300° C. In an embodiment, the SPT wet etch may be performed at 115° C.

In an embodiment, in the SPT wet etch, the ratio of the main spacer 17 etch rate to the offset spacer 15 etch rate may be greater than 5:1. In an embodiment, in the SPT wet etch, the ratio of the main spacer 17 etch rate to the PSR spacer 16 etch rate may be greater than 1:1, such as 2.5:1, and the ratio of the PSR spacer 16 etch rate to the offset spacer 15 etch rate may be less than 8:1.

In an embodiment, the offset spacers 15 may be formed of HCC SiN or C-doped ALD SiN, the PSR spacers 16 may be formed of CVD 760C SiN or ALD SiN, the main spacers 17 may be formed of HCD SiN, and the SPT wet etch may be performed using $H_3PO_4$ at a temperature of 115° C.

FIGS. 2A to 2J show schematic cross-sectional views illustrating structures formed during manufacturing of a semiconductor device (e.g., an HKMG semiconductor device) in accordance with an embodiment of the present invention. Some elements, features, and/or advantages discussed with reference to one or more of FIGS. 2A to 2J may be analogous to or identical to some elements, features, and/or advantages discussed with reference to one or more of FIGS. 1A to 1H.

Figure 2A:
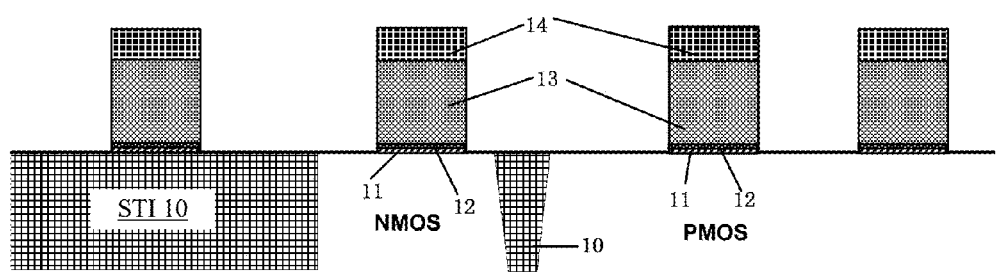
FIGS. 2A to 2J show schematic cross-sectional views illustrating structures formed during manufacturing of a semiconductor device (e.g., an HKMG semiconductor device) in accordance with an embodiment of the present invention.

Referring to FIG. 2A, the method for manufacturing the HKMG semiconductor device may include providing a substrate. The method may include forming shallow trench isolations 10 (STIs 10), an N-type metal-oxide-semiconductor (NMOS) region, and a P-type metal-oxide-semiconductor (PMOS) region in the substrate. The method may include forming a polysilicon dummy gate structure in each of the NMOS region and the PMOS region. The dummy gate structure may include a gate insulating layer 11 (e.g., an HfO layer), a work function material layer 12 (e.g., a TiN layer), a polysilicon dummy gate member 13, and a hard mask 14 that may be sequentially formed on the substrate.

Figure 2B:
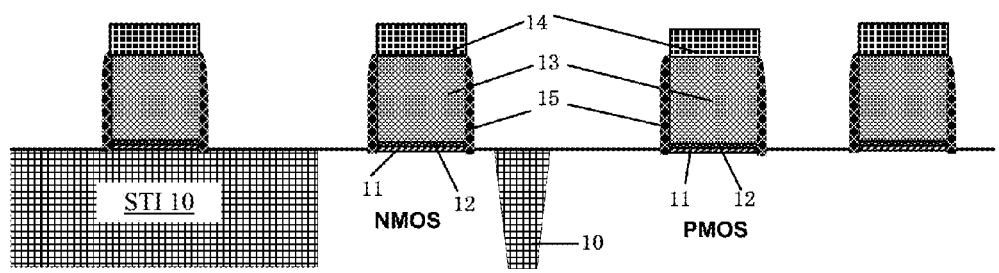

Referring to FIG. 2B, the method may include forming two offset spacers 15 (or first-type spacers 15) at two sides of each polysilicon dummy gate member 13, such that the polysilicon dummy gate member is disposed between the two offset spacers 15. The offset spacers 15 may be formed of silicon nitride (SiN) that has a first wet etch rate, which may be a substantially low wet etch rate. In an embodiment, the offset spacers 15 may be formed of C-doped ALD SiN or HCC SiN. The method may include forming a lightly doped drain (LDD).

Figure 2C:
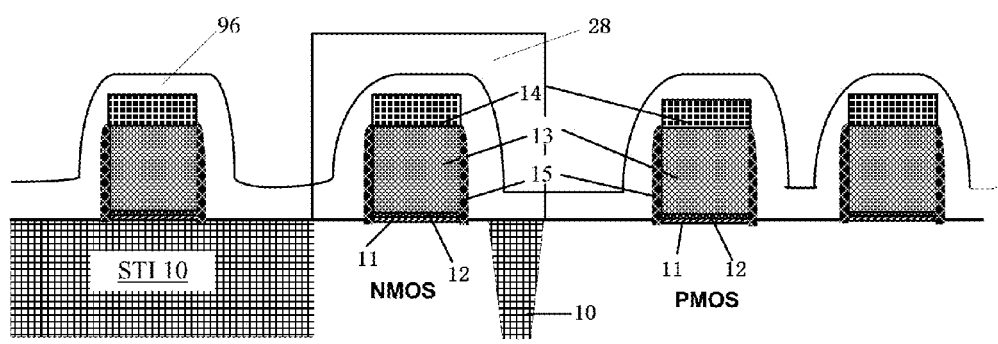

Referring FIG. 2C, the method may include depositing a PSR film 96 to substantially completely cover the dummy gate structures and exposed portions of the substrate. The method may include, subsequently, using a photoresist layer (or PR layer) to substantially completely cover the PSR film 96. The method may include, subsequently, patterning the PR layer through photolithography to form a remaining photoresist 28 (or PR 28) that may substantially completely cover the NMOS region. The PSR film 96 may include or may be made of pure SiN, such as ALD SiN or CVD 760C SiN. The PSR film 96 may also include an oxide layer, such as a silicon oxide ($SiO_2$) layer.

Figure 2D:
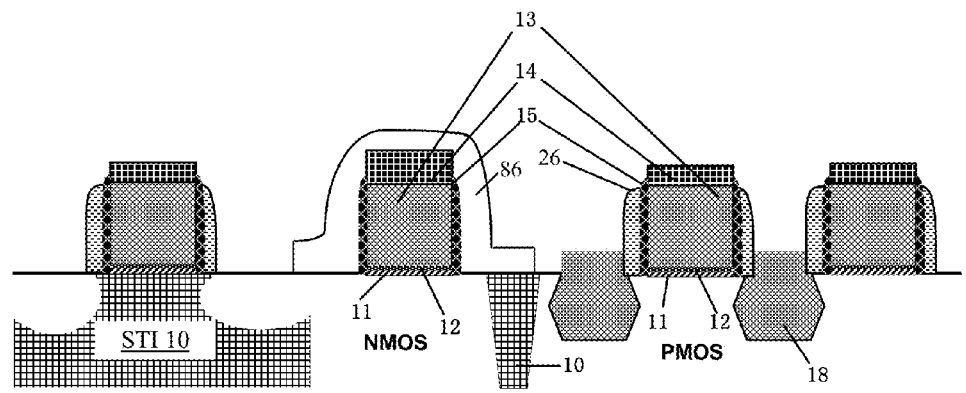

Referring to FIG. 2D, the method may include using dry etch and/or wet etch to form one or more source/drain trenches in the PMOS region and to form two PSR spacers 26 (or second-type spacers 26) at two sides of the offset spacers 15 in the PMOS region (such that the two offset spacers 15 and the polysilicon dummy gate member 13 in the PMOS region may be disposed between the two PSR spacers 26). Each of the source/drain trenches may have a hexagonal cross-section. Being portions of the PSR film 96, the PSR spacers 26 may include or may be made of pure SiN, such as ALD SiN or CVD 760C SiN. The PSR spacers 26 may include an oxide layer, such as a silicon oxide ($SiO_2$) layer. The PSR spacers 26 may have a second wet etch rate. As a result of the dry etch and/or wet etch, a PSR portion 86 previously covered by the PR 28 may remain in the NMOS region. The method may include depositing SiGe in each of the source/drain trench to form a source/drain 18.

Figure 2E:
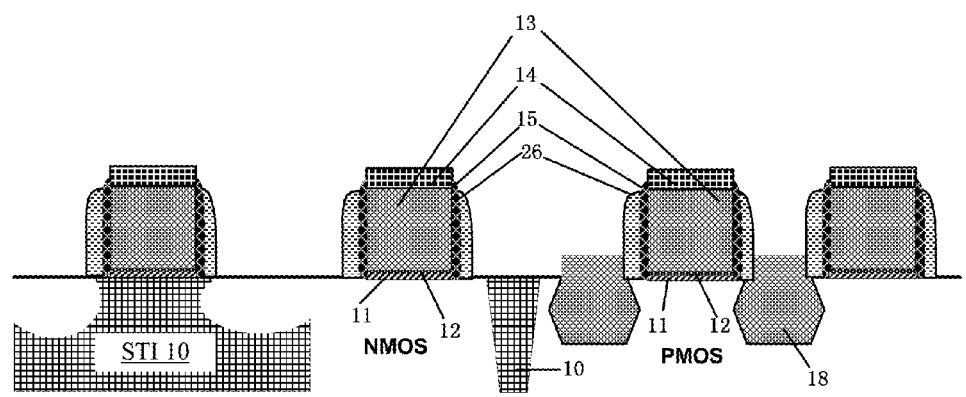

Referring to FIGS. 2D and 2E, the method may include performing photolithography and/or etch on the PSR portion 86 to form two PSR spacers 26 (or second-type spacers 26) at two sides of the offset spacers 15 in the NMOS region (such that the two offset spacers 15 and the polysilicon dummy gate member 13 in the NMOS region may be disposed between the two PSR spacers 26).

Figure 2F:
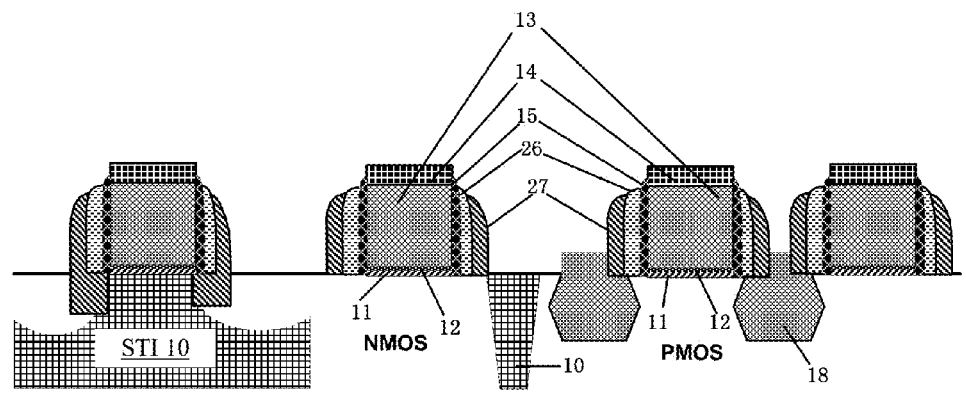

Referring to Referring to FIG. 2F, the method may include forming two main spacers 27 (or third-type spacers 27) at two sides of every two PSR spacers 26, such that the two PSR spacers 26, two offset spacers 15, and a dummy gate structure (including a polysilicon dummy gate member 13) may be disposed between the two main spacers 27. The main spacers 27 may have a third wet etch rate, which may be a substantially high etch rate. The main spacers 27 may be formed of pure SiN, such as HCD SiN. The main spacers 27 may include an oxide, such as $SiO_2$. The main spacers 17 may have a double-layer structure that may include a SiN film and a $SiO_2$ film, wherein the $SiO_2$ film may be thinner than the SiN film.

Figure 2G:
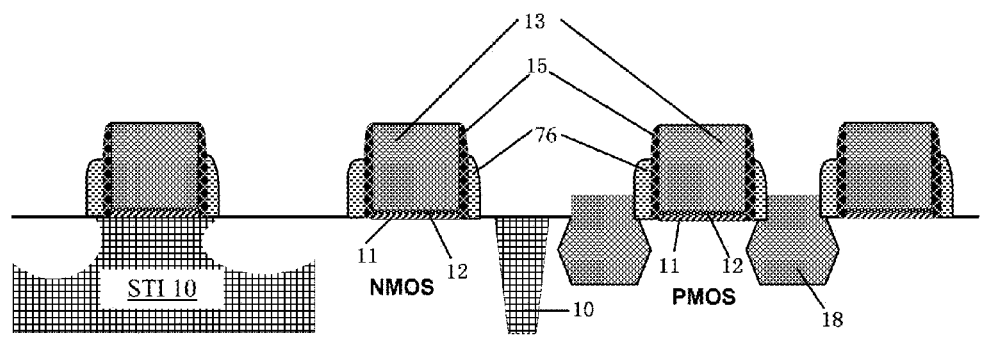

Referring to FIG. 2G, the method may include performing stress proximity technique (SPT) wet etch to substantially completely remove the main spacers 27, while substantially completely retaining the offset spacers 15 and retaining PSR portions 76 of the PSR spacers 26. In the SPT wet etch, the first wet etch rate (which is associated with the offset spacers 15) may be lower than the second wet etch rate (which is associated with the PSR spacers 26) and the third wet etch rate (which is associated with the main spacers 27). Therefore, the offset spacers 15 to may be substantially retained to protect the polysilicon dummy gate members 13, the gate insulating layers 11, and/or the work function material layers 12. Advantageously, the polysilicon dummy gate members 13 may be effectively protected without substantial damage.

In an embodiment, the PSR spacers 26 and main spacers 27 may be formed of pure SiN material(s). The low-wet-etch-rate offset spacers 15 and the intermediate-wet-etch-rate PSR spacers 26 (and/or PSR spacer portions 76) may substantially protect the work function material layers 12 (e.g., TiN layers). Advantageously, the work function material layers 12 may be effectively protected without substantial loss.

Figure 2H:
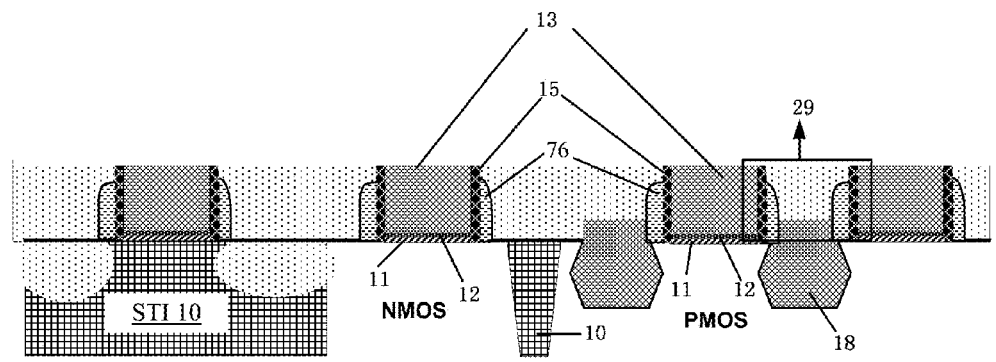

Referring to FIG. 2H, the method may include filling gaps between dummy gate structures with interface layer dielectric (ILD) and performing chemical mechanical polishing (CMP) on the IDL and the dummy gate structures. Referring to FIGS. 2G and 2H, the retained PSR spacer portions 76 and the substantially completely retained offset spacers 15 may form stepped structures 29, which may facilitate the filling of the ILD.

Figure 2I:
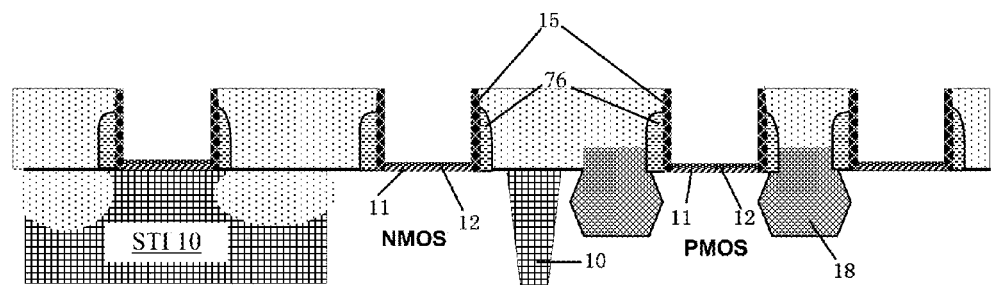
Figure 2J:
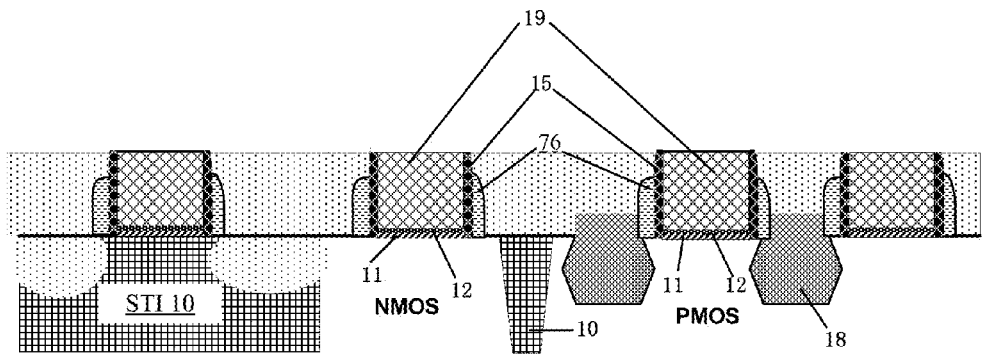

Referring to FIG. 2I, the method may include removing the polysilicon dummy gate members 13 to form spaces. Given that the offset spacers 15 have effectively protected the polysilicon dummy gate members 13, the spaces may have substantially desirable structures (and/or cross-sectional profiles) without substantial residuals of the polysilicon dummy gate members 13.

Referring to FIG. 1J, the method may include filling metal gate material in the spaces and performing chemical mechanical polishing on the filled metal gate material to form metal gate members 19. Since the spaces have substantially desirable structures (and/or profiles), and the metal gate material may be effectively filled in the spaces with minimum voids or substantially no voids.

According to embodiments of the invention, in performing the SPT wet etch for removing the main spacers 27, the PSR spacer portions 76 of the PSR spacers 26 may be retained. The retained PSR spacer portions 76 may advantageously facilitate filling of ILD and may advantageously facilitate protection of the work function material layers 12 (e.g., TiN layers).

The height(s) of the retained PSR spacer portions 76 may be optimally controlled by controlling wet etch rate ratios between the spacers 15, 26, and 27 and/or by controlling conditions of the SPT wet etch. The control of the wet etch rate ratios may be performed by selecting suitable materials for the spacers 15, 26, and 27.

In an embodiment the PSR spacers 26 may be substantially completely removed.

Figure 3A:
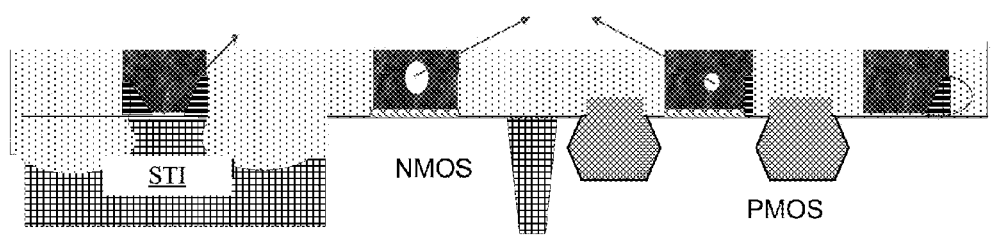
FIG. 3A shows a schematic cross-sectional view illustrating a semiconductor device (e.g., an HKMG semiconductor device) manufactured using a conventional method.

FIG. 3A shows a schematic cross-sectional view illustrating a semiconductor device (e.g., an HKMG semiconductor device) manufactured using a conventional method. The semiconductor device may have substantial defects, such as voids, damage in work function layers, and/or polysilicon residuals.

Figure 3B:
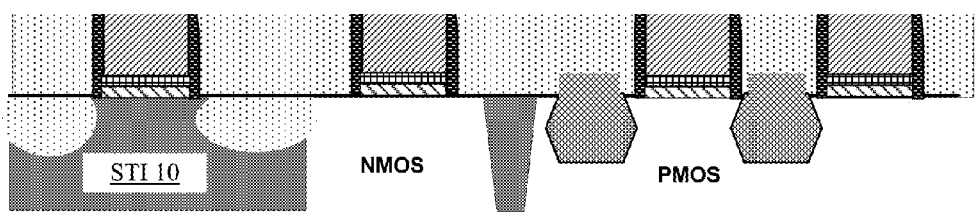
FIG. 3B shows a schematic cross-sectional view illustrating a semiconductor device (e.g., an HKMG semiconductor device) in accordance with an embodiment of the present invention.

FIG. 3B shows a schematic cross-sectional view illustrating a semiconductor device (e.g., an HKMG semiconductor device) in accordance with an embodiment of the present invention. The semiconductor device may have minimum defects, without substantial voids, work function layer damage, or polysilicon residuals.

As can be appreciated from the foregoing, embodiments of the invention may enable effective protection of work function layers and/or effective formation of metal gate members in manufacturing of semiconductor devices. Therefore, satisfactory quality and/or performance of work function layers and/or metal gate members in semiconductor devices may be ensured. Advantageously, embodiments of the invention may contribute to satisfactory semiconductor device quality (and performance) and/or a satisfactory manufacturing yield.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
    forming a dummy gate structure on a substrate, the dummy gate structure comprising a dummy gate member;
    forming two first-type spacers such that the dummy gate member is positioned between the two first-type spacers;
    forming two second-type spacers such that the two first-type spacers and the dummy gate member are positioned between the two second-type spacers;
    forming two third-type spacers such that the two second-type spacers, the two first-type spacers, and the dummy gate member are positioned between the two third-type spacers;
    performing etch to substantially completely remove the two third-type spacers and to at least partially remove the two second-type spacers;
    removing at least a first portion of the dummy gate member to form a space between remaining portions of the two first-type spacers; and
    providing a metal material in the space for forming a metal gate member.

2. The method of claim 1, wherein the first-type spacers have a first etch rate in the etch, wherein the second-type spacers have a second etch rate in the etch, wherein the third-type spacers have a third etch rate in the etch, wherein the first etch rate is less than the second etch rate, and wherein the second etch rate is less than or equal to the third etch rate.

3. The method of claim 2, wherein the third etch rate is greater than five times the first etch rate.

4. The method of claim 3, wherein the third etch rate is greater than the second etch rate, and wherein the second etch rate is less than eight times the first etch rate.

5. The method of claim 1, wherein the second-type spacers include a silicon-nitride layer.

6. The method of claim 5, wherein the second-type spacers further include a silicon-oxide layer that overlaps the silicon-nitride layer.

7. The method of claim 1, wherein the third-type spacers include a silicon-nitride layer.

8. The method of claim 7, wherein the third-type spacers further include a silicon-oxide layer that overlaps the silicon-nitride layer.

9. The method of claim 1, wherein the first-type spacers include at least one of a carbon-doped atomic layer deposition silicon-nitride layer and a hexachloropropane silicon-nitride layer.

10. The method of claim 1, wherein the second-type spacers include at least one of an atomic layer deposition silicon-nitride layer and a chemical vapor deposition 760C silicon-nitride layer.

11. The method of claim 1, wherein the third-type spacers include a hexachlorodisilane silicon-nitride layer.

12. The method of claim 1, wherein the performing the etch includes using a phosphoric acid.

13. The method of claim 12, wherein the etch is performed at a temperature of 115° C.

14. The method of claim 1, further comprising: removing a second portion of the dummy gate member after the performing the etch and before the removing the first portion of the dummy gate member, wherein the second portion of the dummy gate has damage caused by the etch.

15. The method of claim 14, further comprising: removing defective portions of the first-type spacers when removing the second portion of the dummy gate member, wherein the defective portions of the first-type spacers have defects caused by the etch.

16. The method of claim 14, wherein a thickness of the second portion of the dummy gate member in a direction perpendicular to a bottom surface of the substrate is in a range of 40 Å to 200 Å.

17. The method of claim 1, wherein the etch substantially completely removes the second-type spacers.

18. The method of claim 1, wherein portions of the second-type spacers remain after the etch, and wherein a height of the portions of the second-type spacers in a direction perpendicular to a bottom surface of the substrate is less than a height of the remaining portions of the first-type spacers in the direction.

19. The method of claim 1, wherein a thickness of each of the first-type spacers in a direction parallel to a bottom surface of the substrate is in a range of 30 Å to 120 Å, wherein a thickness of each of the second-type spacers in the direction is in a range of 80 Å to 200 Å, and wherein a thickness of each of the third-type spacers in the direction is in a range of 80 Å to 200 Å.

20. The method of claim 1, further comprising: controlling a height of remaining portions of the second-type spacers in a direction perpendicular to a bottom surface of the substrate by controlling at least one of the first etch rate, the second etch rate, the third etch rate, and a condition of the etch, wherein the remaining portions of the second-type spacers remain on the substrate after the etch.

* * * * *